United States Patent
Pickering et al.

(10) Patent No.: US 8,202,621 B2
(45) Date of Patent: *Jun. 19, 2012

(54) OPAQUE LOW RESISTIVITY SILICON CARBIDE

(75) Inventors: Michael A. Pickering, Dracut, MA (US); Jitendra S. Goela, Andover, MA (US)

(73) Assignee: Rohm and Haas Company, Philadelphia, PA (US)

( * ) Notice: Subject to any disclaimer, the term of this patent is extended or adjusted under 35 U.S.C. 154(b) by 1793 days.

This patent is subject to a terminal disclaimer.

(21) Appl. No.: 10/000,975

(22) Filed: Oct. 24, 2001

(65) Prior Publication Data
US 2003/0059568 A1   Mar. 27, 2003

Related U.S. Application Data

(60) Provisional application No. 60/324,184, filed on Sep. 22, 2001.

(51) Int. Cl.
*B32B 9/04* (2006.01)
(52) U.S. Cl. .............. 428/446; 428/66.6; 428/66.7
(58) Field of Classification Search .................. 428/446, 428/66.6, 66.7, 66
See application file for complete search history.

(56) References Cited

U.S. PATENT DOCUMENTS

| | | | |
|---|---|---|---|
| 5,354,580 A | 10/1994 | Goela et al. | 423/345 |
| 5,374,412 A | 12/1994 | Pickering et al. | 423/346 |
| 5,465,184 A | 11/1995 | Pickering et al. | 360/97.01 |
| 5,584,936 A | 12/1996 | Pickering et al. | 118/728 |
| 5,604,151 A | 2/1997 | Goela et al. | 437/100 |
| 5,683,028 A | 11/1997 | Goela et al. | 228/121 |
| 5,910,221 A * | 6/1999 | Wu | 118/723 R |
| 6,001,756 A | 12/1999 | Takahashi et al. | |
| 6,048,403 A | 4/2000 | Deaton et al. | |
| 6,090,733 A * | 7/2000 | Otsuki et al. | 501/90 |
| 6,200,388 B1 | 3/2001 | Jennings | |
| 6,214,755 B1 | 4/2001 | Otsuki et al. | |
| 6,217,842 B1 | 4/2001 | Tanino | 427/248 |
| 6,300,226 B1 | 10/2001 | Miyata et al. | |
| 6,440,866 B1 * | 8/2002 | Collins et al. | 438/714 |
| 6,936,102 B1 * | 8/2005 | Otsuki et al. | 117/84 |

(Continued)

FOREIGN PATENT DOCUMENTS

JP  2000119064 A  *  4/2000

OTHER PUBLICATIONS

Northern Lights Optics, Optical Design for amateur telescope makers; http://www.minerals.sk.ca/atm_design/materials/silicon_carbide.html; pp. 1-3; May 20, 2004.

(Continued)

*Primary Examiner* — Jane Rhee
(74) *Attorney, Agent, or Firm* — John J. Piskorski

(57) ABSTRACT

An opaque, low resistivity silicon carbide and a method of making the opaque, low resistivity silicon carbide. The opaque, low resistivity silicon carbide is a free-standing bulk material that may be machined to form furniture used for holding semi-conductor wafers during processing of the wafers. The opaque, low resistivity silicon carbide is opaque at wavelengths of light where semi-conductor wafers are processed. Such opaqueness provides for improved semi-conductor wafer manufacturing. Edge rings fashioned from the opaque, low resistivity silicon carbide can be employed in RTP chambers.

20 Claims, 2 Drawing Sheets

U.S. PATENT DOCUMENTS

2002/0004444 A1  1/2002  Goela et al.
2003/0036471 A1  2/2003  Goela et al.

OTHER PUBLICATIONS

Goela et al.; "High Thermal Conductivity SiC and Applications"; Hi Thermal Conductivity Materials (2006); AN 2006:19410.

Bolch et al.; Silicon Carbide Makes Superior Mirrors; Laser Focus World (1989); pp. 97-105.

Shih et al.; "The Application of Hot-Pressed Silicon Carbide to Large High-Precision Optical Structures"; SPIE vol. 2543 (1995); pp. 24-37.

* cited by examiner

OPAQUE LOW RESISTIVITY SILICON CARBIDE

This application claims the benefit of U.S. Provisional Application(s) No(s).: 60/324,184 filing date Sep. 22, 2001

BACKGROUND OF THE INVENTION

The present invention is directed to an opaque, low resistivity silicon carbide. More specifically, the present invention is directed to an opaque, low resistivity silicon carbide that is opaque within a specific wavelength of light.

Silicon carbide, especially silicon carbide produced by chemical vapor deposition (CVD-SiC), has unique properties that make it a material choice in many high temperature applications. Chemical vapor deposition processes for producing free-standing silicon carbide articles involve a reaction of vaporized or gaseous chemical precursors in the vicinity of a substrate to result in silicon carbide depositing on the substrate. The deposition reaction is continued until the deposit reaches the desired thickness. To be free standing, the silicon carbide is deposited to a thickness of upward of about 0.1 mm. The deposit is then separated from the substrate as a free-standing article that may or may not be further processed by shaping, machining, or polishing and the like to provide a final silicon carbide article.

In a chemical vapor deposition silicon carbide production run, a silicon carbide precursor gas, such as a mixture of methyltrichlorosilane (MTS), hydrogen and argon, is fed to a deposition chamber where the mixture is heated to a temperature at which the mixture reacts to produce silicon carbide. Hydrogen scavenges chlorine that is released from the MTS when the MTS dissociates during the reaction. An inert, non-reactive gas such as argon or helium is employed as a carrier gas for MTS (a liquid at room temperature). Inert gases also act as a diluent whose flow rate can be varied to optimize the reaction and assures removal of by products from the reaction/deposition zone. The silicon carbide deposits as a layer or shell on a solid mandrel provided in the deposition chamber. After the desired thickness of silicon carbide is deposited on the mandrel, the coated mandrel is removed from the deposition chamber and the deposit separated therefrom. The monolithic free-standing article may then be machined to a desired shape. Several CVD-SiC deposition systems are described in U.S. Pat. Nos. 5,071,596; 5,354,580; and 5,374,412.

Pure CVD-SiC has relatively high electrical resistivity. While this is a desirable characteristic for certain applications, such a characteristic is a limitation restricting its use in other applications. Certain components, such as plasma screens, focus rings and edge rings used in plasma etching chambers need to be electrically conductive as well as possess high temperature stability. While high temperature properties of CVD-SiC have made it a material of choice for use in such chambers, its high resistivity has limited its use in fabricating components that require a greater degree of electrical conductivity.

High electrical resistivity of CVD-SiC has further restricted its use in applications that are subject to the buildup of static electricity. The need to ground components used in such applications requires that they possess greater electrical conductivity than is generally found in CVD-SiC. A low resistivity silicon carbide would provide a unique and useful combination of high temperature properties with suitable electrical conductivity properties for use in applications where grounding is required.

U.S. patent application Ser. No. 09/90,442, filed Feb. 21, 2001, (non-provisional of provisionally filed U.S. application 60/184,766, filed Feb. 24, 2000), assigned to the assignee of the present application discloses a chemical vapor deposited low resistivity silicon carbide (CVD-LRSiC) and method of making the same. Electrical resistivity of the silicon carbide is 0.9 ohm-cm or less. In contrast, the electrical resistivity of relatively pure silicon carbide, prior to the CVD-LRSiC of the application Ser. No. 09/790,442, is in excess of 1000 ohm-cm. The method of preparing the CVD-LRSiC employs many of the same components as the CVD methods disclosed above except that nitrogen is also employed. The lower resistivity of the silicon carbide is believed to be attributable to a controlled amount of nitrogen throughout the silicon carbide as it is deposited by CVD. The nitrogen is incorporated in the deposit by providing a controlled amount of nitrogen with the precursor gas in the gaseous mixture that is fed to the reaction zone adjacent a substrate. The reaction is carried out in an argon gas atmosphere. As the silicon carbide precursor reacts to form the silicon carbide deposit, nitrogen from the gaseous mixture is incorporated into the deposit. The CVD-LRSiC contains at least $6.3 \times 10^{18}$ atoms of nitrogen per cubic centimeter of CVD-LRSiC.

While the resistivity of CVD-SiC can theoretically be lowered to a desired level by the introduction of a sufficient amount of impurities, the resulting elevated levels of impurities adversely affect other properties of the SiC such as thermal conductivity and/or high temperature stability. The CVD-LRSiC is relatively free of impurities, containing less than 10 ppmw of impurity trace elements as determined by gas discharge mass spectroscopy. The CVD-LRSiC is further characterized by thermal conductivity of at least 195 Watts/meter degree Kelvin (W/mK) and a flexural strength of at least 390 MPa.

The CVD-LRSiC is electrically conductive and possesses high temperature stability in addition to being a high purity SiC. Thus, the free standing CVD-LRSiC may be readily employed in high temperature furnaces such as semiconductor processing furnaces and plasma etching apparatus. The CVD-LRSiC may be sold as a bulk material or may be further processed by shaping, machining, polishing and the like to provide a more finished free-standing article. For example, the CVD-LRSiC may be machined into plasma screens, focus rings and susceptors or edge rings for semi-conductor wafer processing and other types of high temperature processing chamber furniture as well as other articles where CVD-LRSiC material is highly desirable.

In the manufacture of semi-conductor wafers, there are numerous process steps. One set of steps is referred to as epitaxial deposition, and generally consists of depositing a thin layer (between about 10 to less than one micron) of epitaxial silicon upon the wafer. This is achieved using specialized equipment such as SiC wafer boats or SiC susceptors or edge rings to secure the semi-conductor wafers in processing chambers, and a chemical vapor deposition (CVD) process. The CVD process requires that the wafer be heated to very high temperatures, on the order of 1200° C. (2000° F.).

There has been a recent trend in the semi-conductor art to employ equipment that operates upon a single wafer, rather than a group of wafers. In single wafer equipment the heating of the wafer to the CVD temperature is greatly accelerated such that the wafer is taken from about room temperature to an elevated temperature within about 30 seconds. Such processing is known as rapid thermal processing or RTP. RTP includes depositing various thin films of different materials by an RTP-CVD process, rapid annealing of wafers (RTP thermal processing) and rapid oxidation to form silicon dioxide. While the silicon wafer can accept such rapid temperature change well, the wafer must be held in position by a susceptor or edge ring that can also withstand such rapid temperature changes. Susceptor or edge rings composed of CVD-SiC or CVD-LRSiC have proved very suitable for withstanding RTP conditions.

Many RTP systems employ high intensity W-halogen lamps to heat semi-conductor wafers. Pyrometers are used to measure and to control wafer temperature by controlling the output of the W-halogen lamps. Accurate and repeatable temperature measurements for wafers over a wide range of values are imperative to provide quality wafers that meet the requirements for integrated circuit manufacturing. Accurate temperature measurement requires accurate radiometric measurements of wafer radiation. Background radiation from W-halogen lamps (filament temperature of about 2500° C.) or from other sources can contribute to an erroneous temperature measurement by the pyrometer especially at low temperatures (about 400° C.) where the radiant emission from the wafer is very low compared to the lamp output. Also, any light from the W-halogen lamps that passes through (transmits) a susceptor or edge ring can cause an incorrect temperature reading by the pyrometer.

The industry has addressed the temperature problems by designing the RTP chamber with single sided heating and mounting the pyrometers on the chamber bottom opposite the light source. To further reduce light interference, the area under the wafer was made "light tight", thus eliminating stray reflected light from entering the area under the wafer. In addition to redesigning the RTP chamber, CVD-SiC or CVD-LRSiC edge rings and susceptors were made opaque to W-halogen lamp light in the wavelength range that pyrometers operate by coating the rings with 200 μm (0.008 inches) of poly-silicon. However, coating edge rings with poly-silicon adds substantial cost to the edge rings. Further, the coating process (epitaxial silicon growth) has many technical problems associated with it such as dendritic growth, bread loafing around edges and purity problems that reduce yields. Poly-silicon coating adds thermal mass to the edge rings. The increased thermal mass limits heating ramp rates during RTP processing cycles. Ideally, edge rings have a thermal mass that is as low as possible to achieve the fastest heating ramp rates. The faster the ramp rate the shorter the processing cycle time for wafers, thus reducing wafer processing costs. Another advantage to faster ramp rates is that the total integrated time at high temperature for the wafers is reduced allowing for less diffusion of any dopant species employed during processing. Such is highly desirable as the feature sizes decrease for semiconductor devices (trend in the semiconductor industry). As the feature size gets smaller the distance traveled by dopant atoms also gets smaller.

Accordingly, although there are highly suitable CVD-LRSiC articles that may be employed in semi-conductor wafer processing chambers, there is still a need for improved CVD-LRSiC articles that are opaque at certain wavelengths.

SUMMARY OF THE INVENTION

The present invention is directed to free standing, opaque low resistivity silicon carbide that has a resistivity of less than 0.10 ohm-cm, and a process for making the opaque low resistivity silicon carbide. The opaque low resistivity silicon carbide is opaque to light in a wavelength range of from about 0.1 μm to about 1.0 μm at a temperature of at least about 250° C. Because the low resistivity silicon carbide (LRSiC) is opaque at wavelengths of light from about 0.1 μm to about 1.0 μm, the low resistivity silicon carbide advantageously may be employed as furniture in semi-conductor processing chambers where accurate maintenance of semi-conductor wafer temperatures are desired. Since the low resistivity silicon carbide is opaque at wavelengths of light from about 0.1 μm to about 1.0 μm, light from heating lamps employed in wafer processing chambers does not pass through the low resistivity silicon carbide, thus allowing a more accurate reading of wafer temperatures. Accordingly, defects in wafers caused by improper temperatures are reduced or eliminated.

Further, because the low resistivity silicon carbide need not be coated with poly-silicon to provide the appropriate opaqueness, such problems as dendritic growth, bread loafing and the high cost of coating are eliminated. Also, the problem of adding thermal mass to silicon carbide articles is eliminated. Thus, faster heating ramp rates for rapid thermal processing are achieved with articles prepared from the low resistivity silicon carbide of the present invention. The faster heating ramp rates in turn provide for reduced total integrated time at high temperatures for wafers and reduced diffusion of dopant during processing.

The opaque, low resistivity silicon carbide of the present invention is prepared by chemical vapor deposition. High concentrations of nitrogen are employed in the CVD process. Reactants are mixed together with the high concentrations of nitrogen in a CVD chamber, and the silicon carbide product is deposited on a substrate such as a mandrel. The CVD deposited silicon carbide when exposed to a temperature of at least 250° C. is opaque at light wavelengths of from about 0.1 μm to about 1.0 μm. In addition to having low resistivity and to being opaque to light at wavelengths of from about 0.1 μm to about 1.0 μm, the silicon carbide is stable at high temperatures, has a high thermal conductivity and is of a high purity. The opaque, low resistivity silicon carbide may be removed from the mandrel and retained in bulk form or may be shaped, machined and polished to provide a final article.

A primary objective of the present invention is to provide for a free standing, low resistivity silicon carbide.

Another objective of the present invention is to provide for a free standing, low resistivity silicon carbide that is opaque to light at wavelengths of from about 0.1 μm to about 1.0 μm.

A further objective of the present invention is to provide a thermally stable free standing, low resistivity silicon carbide.

An additional objective of the present invention is to provide a free standing, low resistivity silicon carbide that has a high purity.

Other objectives and advantages of the present invention may be ascertained by a person of skill in the art after reading the following disclosure and the appended claims.

DETAILED DESCRIPTION OF THE INVENTION

Figure 1:
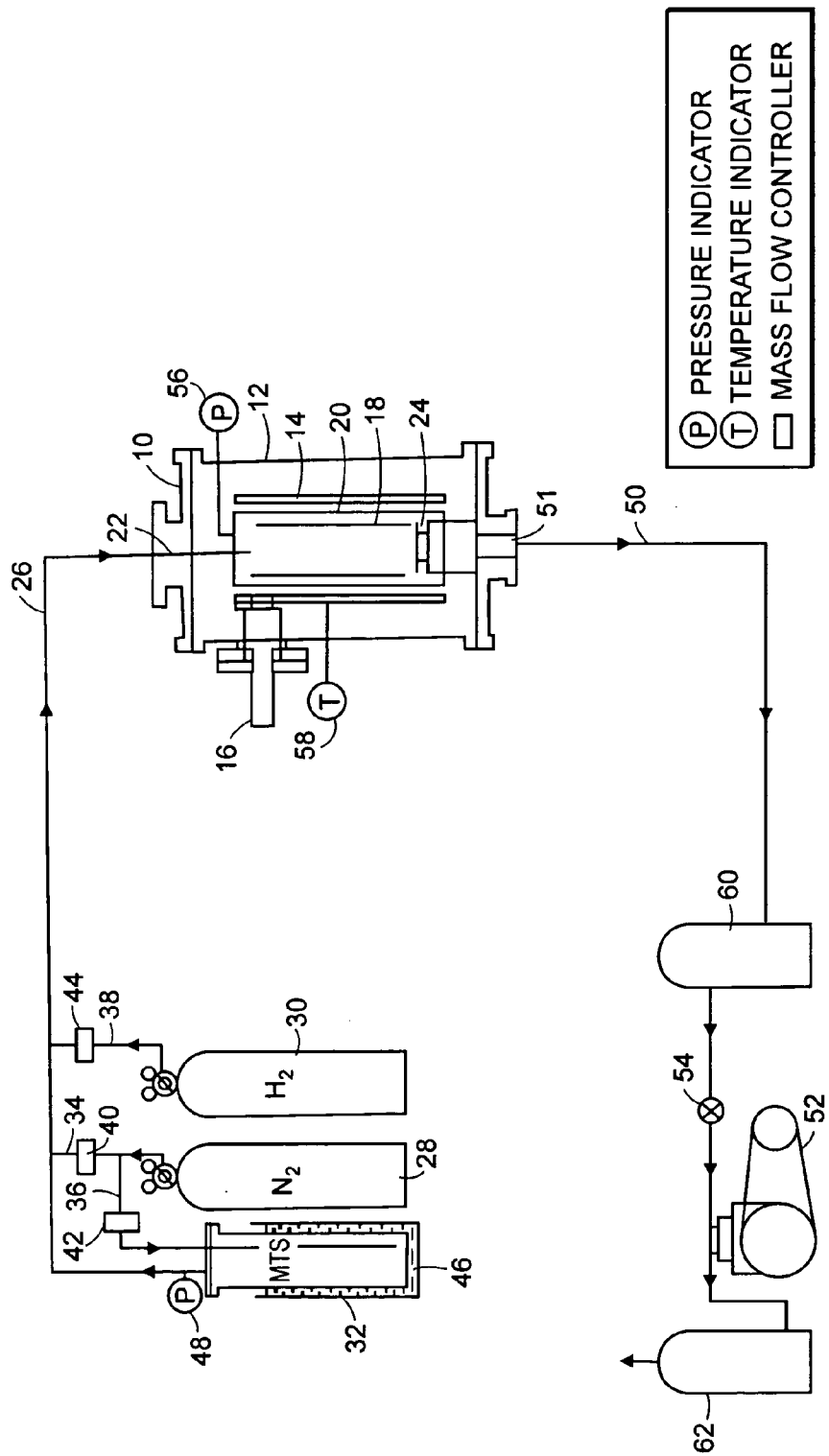
FIG. 1 is a schematic of a CVD apparatus that may be used to fabricate opaque, low resistivity silicon carbide.

Chemical vapor deposited (CVD) silicon carbide of the present invention has low electrical resistivity of less than 0.10 ohm-cm, and is opaque to light at wavelengths of from about 0.1 μm to about 1.0 μm at a temperature of at least about 250° C. Such silicon carbide is bulk or freestanding, i.e., capable of being self-supported. Bulk or free-standing silicon carbide is distinguished from thin film silicon carbide which are deposited upon a surface with the intent that the silicon carbide remain permanently bonded to the surface. Bulk or free-standing silicon carbide can be machined and polished to a desired size and shape. Such silicon carbide may be employed as furniture in processing chambers for chemical vapor deposition (CVD), rapid thermal processing (RTP), epitaxial deposition and the like. In addition to having a low resisitivity and being opaque to light at wavelengths of from about 0.1 μm to about 1.0 μm, the opaque, low resistivity silicon carbide has a high thermal conductivity, high flexural strength, and high thermal stability. The opaque, low resistivity silicon carbide is relatively free of metallic impurities containing less than about 5 ppmw of impurity trace elements such as boron, phosphorous and the like as determine by gas discharge mass spectroscopy. Additionally, the opaque, low resistivity silicon carbide has reduced thermal mass. All numerical ranges are inclusive and combinable in the present application.

The opaque, low resistivity silicon carbide is prepared by chemical vapor deposition. To provide an opaque, low resistivity silicon carbide, high concentrations of nitrogen are incorporated into the CVD silicon carbide. High concentrations of nitrogen are incorporated into the silicon carbide by providing a high concentration nitrogen atmosphere for the silicon carbide precursors to react. Nitrogen atmosphere means that no inert, non-reactive gases such as argon, helium or other noble gas is employed in preparing the opaque, low resistivity silicon carbide. The atmosphere composes greater than 32% by volume of nitrogen, preferably at least about 40% by volume of nitrogen. Preferably the atmosphere composes from about 45% to about 50% by volume of nitrogen. The remainder of the atmosphere is composed of hydrogen gas and silicon carbide precursors as well as water vapor. Nitrogen is incorporated into silicon carbide in amounts of greater than $1.5 \times 10^{19}$ to as high as about $2 \times 10^{19}$ to about $3 \times 10^{19}$ atoms of nitrogen per cubic centimeter of silicon carbide. While not being bound to theory, nitrogen is believed to act as a dopant that reduces band gaps in the silicon carbide to reduce resistivity. Nitrogen may be employed in any suitable form such as $N_{2(g)}$, volatile organic compounds containing —$NO_2$ or amine groups such as —$NH_2$, compounds of —$N(H)_4^+$ and quaternary amines, $NO_3^-$ salts in aqueous form, halogen containing nitrogen compounds, and the like. Examples of suitable nitrogen compounds include $NF_3$ and $NH_3$.

Silicon carbide precursor is selected from materials that can be reacted to form silicon carbide. Such materials include a component, such as a silane or a chlorosilane, which can react to form a silicon moiety and a component such as a hydrocarbon that can react to form a carbon moiety. The component contributing the silicon moiety can be different from, or can be the same as, the component contributing the carbon moiety. Hydrocarbon substituted silanes are preferred silicon carbide precursors because they contain both the silicon carbide moieties in a single compound. The precursor(s) can be a compound which dissociates at the reaction conditions forming one or both of the silicon carbide moieties, or the precursors can be two or more compounds which react to provide one or both of the moieties. While the precursor(s) needs to be in the gas phase when reacted in the vicinity of the substrate, it is not necessary that the precursor's boiling point be less than ambient temperature. Methyltrichlorosilane (MTS) is a preferred precursor, especially when used with hydrogen ($H_2$), which scavenges chlorine released when MTS dissociates. Since MTS provides both silicon and carbon in a stoichiometric ratio of about 1:1, no other source of silicon and carbon moieties is required. $H_2$/MTS molar ratio ranges from about 2 to about 10, preferably from about 4 to about 7. Hydrogen partial pressure ranges from about 75 torr to about 100 torr, preferably from about 85 torr to about 95 torr. MTS partial pressure ranges from about 10 torr to about 25 torr, preferably from about 15 torr to about 20 torr.

Nitrogen may be provided in any suitable form as long as the form is sufficiently volatile or may be made sufficiently volatile to form a gas. Nitrogen partial pressures range from about 80 torr to about 110 torr, preferably from about 90 torr to about 105 torr. No inert, non-reactive gases such as argon, helium or other noble gas is employed in preparing the opaque, low resistivity silicon carbide.

Deposition chamber pressures range from about 100 torr to about 300 torr, preferably from about 150 torr to about 250 torr. Deposition chamber temperatures range from about 1250° C. to about 1400° C., preferably from about 1300° C. to about 1375° C.

Deposition substrates may be composed of any suitable material that can withstand the harsh conditions of the deposition chambers. An example of a suitable substrate or mandrel for depositing silicon carbide is graphite. Graphite mandrels as well as other types of mandrels may be coated with a release agent such that deposited silicon carbide may be readily removed from the mandrel after deposition. Silicon carbide deposits may be removed from mandrels by controlled oxidation (controlled combustion).

An example of a chemical vapor deposition system for producing opaque, low resistivity silicon carbide articles of the present invention is illustrated in FIG. 1. Deposition is carried out within furnace 10. A stainless steel wall provides a cylindrical deposition chamber 12. Heating is provided by a graphite heating element 14 which is connected to an external power supply by an electrode 16. Graphite deposition mandrels are arranged within a graphite isolation tube 20 and gas is introduced by means of an injector 22 through the upper end of the isolation tube so that the reaction gases sweep along mandrels 18. One or more baffle(s) 24 is used to control the aerodynamics of gas flow through furnace 10. Line 26, which supplies injector 22, is fed by a nitrogen cylinder 28, a hydrogen cylinder 30, and a MTS bubbler 32. Nitrogen is fed by lines 34 and 36 both directly to inlet line 26 and through bubbler 32. The hydrogen cylinder 30 is connected by line 38 to the inlet line 26. Nitrogen flow through lines 32 and 36 and hydrogen flow through line 38 are controlled by mass flow controllers 40, 42, and 44. The MTS bubbler 32 is maintained at a constant temperature by a constant temperature bath 46. A pressure gauge 48 is connected to a feed back loop that controls the gas pressure of bubbler 32.

Outlet line 50 is connected to a bottom outlet port 51. Pressure within the deposition chamber 12 is controlled by a vacuum pump 52 which pulls gases through the chamber and a furnace pressure control valve 54 operably connected to the vacuum pump. Temperature and pressure within deposition chamber 12 are measured by thermal probe 58 and pressure indicator 56. Exhaust gases are passed through filter 60 to remove particulate material upstream of the pressure control valve and through a scrubber 62 downstream of the vacuum pump to remove HCl.

After deposition the bulk or free-standing low resistivity silicon carbide may be sold in bulk form or further processed by shaping, machining, polishing and the like to form a desired article. Further processing involves numerous methods that are well known in the art for free-standing silicon carbide. Such methods often involve diamond polishing and machining. An example of an article made from the low resistivity silicon carbide is a susceptor or edge ring employed to hold or secure semi-conductor wafers for processing in furnaces or other suitable chambers.

Advantageously, when the free-standing low resistivity silicon carbide is exposed to a temperature of at least about 250° C. the silicon carbide becomes opaque at light wavelengths of from about 0.1 µm to about 1.0 µm, preferably from about 0.7 µm to about 0.95 µm. Low resistivity silicon carbide may remain opaque to light at wavelengths of from about 0.1 µm to about 1.0 µm to temperatures of up to about 1450° C. At such wavelengths, silicon carbide articles do not transmit light and are highly suitable for furniture in semi-conductor processing chambers. Such chambers include, but are not limited to, RTP processing chambers where pyrometers that operate at wavelengths of about 0.7 µm to about 0.95 µm monitor semiconductor wafer temperatures. Such RTP chambers may operate at temperatures of from about 300° C. to about 1250° C. Opaque low resistivity silicon carbide of the present invention remains opaque to light at wavelengths of from about 0.1 µm to about 1.0 µm at such temperatures. Since the opaque, low resistivity silicon carbide does not transmit light at wavelengths where pyrometers operate, temperature readings of semi-conductor wafers are more accurate when processed on furniture composed of the silicon carbide of the present invention. Thus, fewer defects occur in processed wafers and cost efficiency is improved.

Since the opaque low resistivity silicon carbide is opaque to light wavelengths at which a pyrometer operates, susceptors or edge rings employed in RTP need not be coated with polysilicon. Accordingly, articles composed of silicon carbide within the scope of the present invention eliminate the problems of epitaxial silicon growth such as dendritic growth, bread loafing and any impurities that may occur during the poly-silicon coating process. Such impurities may lead to contamination of semi-conductor wafers during RTP. Elimination of the poly-silicon coating process also reduces overall coat of making silicon carbide articles as well as processing semi-conductor wafers.

Additionally, elimination of unnecessary coatings on edge rings reduces the thermal mass of the edge ring and further improves the RTP in semi-conductor wafer manufacturing. Reduced thermal mass permits faster ramp rates in RTP, thus reducing semi-conductor processing cycle time, and reducing wafer processing costs. Further, as ramp rates increase the total integrated time at high temperature for wafers is reduced allowing for less diffusion of any dopant species in the RTP. Reduced diffusion of dopant species into semi-conductor wafers in turn permits features on the wafers to be decreased (an industry goal).

Low electrical resistivity of the silicon carbide of the present invention is also desirable for radio frequency (RF) heated susceptors to couple the RF field to the susceptor and for components in the plasma etch chamber to couple the plasma energy to the component. In addition, due to low resistivity the wafer holders can be grounded and do not build a static charge on them. Articles made from the low resistivity silicon carbide include, but are not limited to, edge rings or susceptor rings, wafer boats, epi susceptors, and plasma etch components such as gas diffusion plates, focused rings, plasma screens and plasma chamber walls, and the like. Because the silicon carbide of the present invention has a low resistivity, the silicon carbide may be employed as components in electrical devices such as electrodes and heating elements. Chemically vapor deposited low electrical resistivity silicon carbide prepared by the method of the present invention may have an electrical resistivity of less than 0.50 ohm-cm. Preferred silicon carbide prepared by the method of the present invention has an electrical resistivity of less than 0.10 ohm-cm, and most preferred silicon carbide has an electrical resistivity of from about 0.005 ohm-cm to about 0.05 ohm-cm.

Figure 2A:
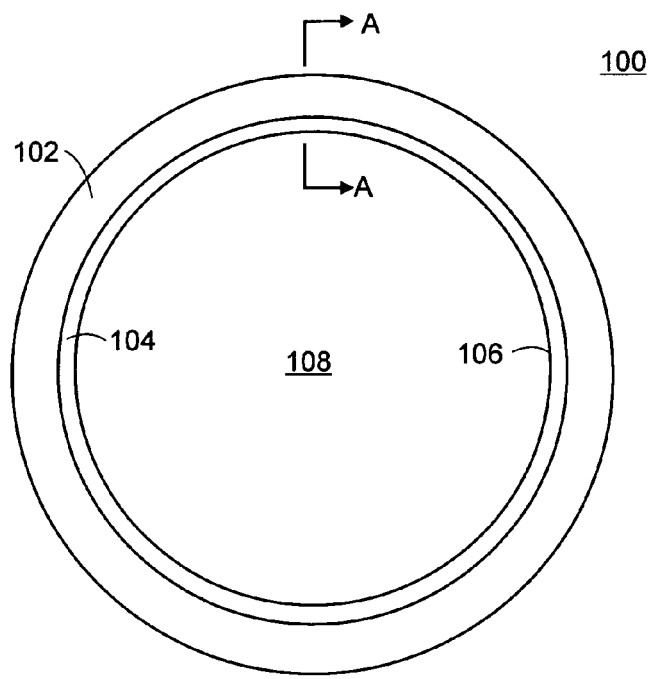
FIG. 2A is a top view of an edge ring composed of CVD deposited opaque, low resistivity silicon carbide.
Figure 2B:
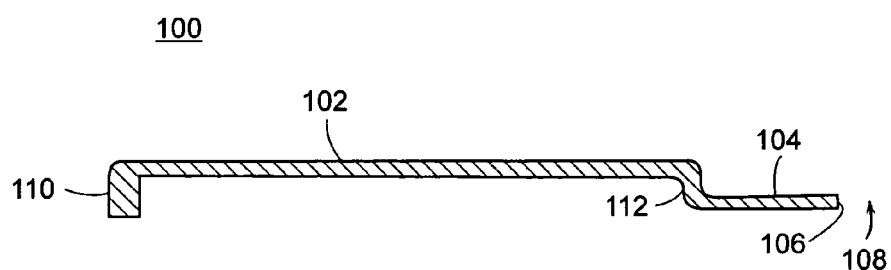
FIG. 2B is a cross-section of an edge ring composed of CVD deposited opaque, low resistivity silicon carbide.

FIGS. 2A and 2B show an edge ring machined and polished from a single piece of opaque, low resistivity silicon carbide within the scope of the present invention. Edge ring 100 has a circular circumference composed of main ring component 102 with wafer holding flange 104 continuous with main ring component 102. Wafer holding flange 104 terminates at edge 106 to form void 108. FIG. 2B is a cross-section of edge ring 100 along line A-A. Main ring component 102 terminates at an outer surface in support flange 110 that is continuous with main ring component 102. Main ring component 102 terminates at an inner surface with flange 112 which is continuous with wafer holding flange 104, thus securing wafer holding flange 104 to main ring component 102.

Although FIGS. 2A and 2B show an edge ring as a circular article, any suitable shape may be employed. A circular edge ring is illustrated in FIGS. 2A and 2B because many semi-conductor wafers are in a circular shape. Size and thickness of the edge ring may also vary considerable. However, the thinner the edge ring, the more suitable the ring is for processing semi-conductor wafers. A thinner edge ring can heat up faster in wafer processing furnaces than a relatively thick edge ring, thus reducing the amount of processing time. Thickness of opaque low resistivity silicon carbide edge rings may range from about 0.1 mm to about 1.0 mm, preferably from about 0.25 mm to about 0.5 mm.

The following examples are intended to further illustrate the present invention and are not intended to limit the scope of the invention.

EXAMPLE 1

Free-standing opaque, low resistivity silicon carbide was prepared in an apparatus similar to the apparatus illustrated in FIG. 1. Deposition temperature in the CVD chamber was about 1350° C. and pressure was about 200 torr. Hydrogen partial pressure was about 90 torr, nitrogen partial pressure was about 93 torr (a nitrogen content of about 46.5% by volume of the CVD chamber), and MTS partial pressure was about 17 torr. No inert or noble gases were employed in the CVD process. Silicon carbide was deposited onto a graphite mandrel coated with a release agent. The deposition process was performed over about 48 hours. The process produced an edge ring that was opaque to light at a wavelength range of from about 0.7 µm to about 0.95 µm at temperatures of about 300° C. and higher.

A control free-standing silicon carbide bulk material was also prepared. The control free-standing silicon carbide was prepared by the same process as described above except that nitrogen was not employed. Instead, argon gas was used. The argon gas partial pressure was about 93 torr. Deposition was performed over about 48 hours.

After deposition, silicon carbide from each mandrel was removed and machined to form an edge ring similar in shape and dimensions as shown in FIGS. 2A and 2B. The bulk resistivity of the edge ring prepared using nitrogen instead of argon gas was measured on four witness samples taken at four locations around the ring. The bulk resistivity ranged from about 0.009 ohm-cm to about 0.015 ohm-cm.

The bulk resistivity of the silicon carbide produced in the chamber containing argon gas ranged from about 1.0 ohm-cm to about 100 ohm-cm from samples taken from four locations. The edge ring prepared with argon gas in the chamber was coated with about a 200 µm of polysilicon by an epitaxial silicon growth process to make the ring opaque to light at wavelengths of from about 0.7 to about 0.95 µm at RTP temperatures.

The low resistivity edge ring was fabricated to a thickness to achieve the same thermal mass as the poly-silicon coated silicon carbide ring. The control ring had a nominal thickness of about 0.25 mm with about a 200 micron silicon coating. The low resistivity silicon carbide ring had a nominal thickness of about 0.36 mm. This was done to obtain a head-to-head comparison of the ring performance.

Each edge ring was then employed in RTP to test their thermal performance in processing semi-conductor wafers. A semi-conductor silicon wafer was placed in each edge ring. The edge rings with their semi-conductor wafers were placed in an RTP Radiance® apparatus for processing. The temperature in the RTP apparatus was raised from about 20° C. to about 1200° C. over about 10 seconds. The heat source in the RTP apparatus was a high intensity W-halogen lamp (filament temperature about 2500° C.). The temperature of each semi-conductor wafer was monitored by an optical pyrometer (operating at a light wavelength of from about 0.7 µm to about 0.95 µm). Temperature uniformity of each semi-conductor wafer was measured about the same and less than 10 degrees over the duration of processing.

Although both edge rings were opaque to light at the wavelength of from about 0.7 µm to about 0.95 µm and performed about the same, the edge ring coated with poly-silicon was more costly to prepare because of the additional coating step and material. Thus, even though both rings performed well, the edge ring of the present invention was still an improvement over the coated edge ring because it was less costly to manufacture.

EXAMPLE 2

A free standing opaque, silicon carbide edge ring having a shape similar to the edge ring illustrated in FIGS. 2A and 2B was prepared by the same process as in Example 1 above with a high concentration nitrogen atmosphere. As in Example 1 above, the bulk resistivity of the edge ring was measured at four locations and ranged from about 0.009 to about 0.015 ohm-cm. The edge ring had about a 30% lower thermal mass than the edge ring in Example 1 because its thickness was about 0.25 mm versus about 0.36 mm for the edge ring in Example 1 and there was no poly-silicon coating. The low resistivity silicon carbide edge ring was opaque to light at a wavelength of from about 0.7 µm to about 0.95 µm at a temperature of about 300° C. and higher.

A silicon wafer was placed in the edge ring and the assembly was placed into an RTP Radiance® for similar thermal testing as in Example 1. The temperature of the RTP chamber went from about 20° C. to about 1200° C. in about 10 seconds. The low resistivity silicon edge ring was opaque to light at a wavelength of from about 0.7 µm to about 0.95 µm during the wafer processing. The heat source in the RTP chamber was a W-halogen lamp (filament temperature of about 2500° C.). The temperature of the wafer was monitored by an optical pyrometer (operating at a light wavelength of from about 0.7 µm to about 0.95 µm).

Temperature uniformity around the edges of the wafer fluctuated on the average about 5 centigrade degrees. Thus, temperature uniformity was better than the coated and uncoated edge rings of Example 1. Also, less lamp power (about 20% less), and therefore longer lamp life, was needed to achieve the process temperature cycles to process the wafer. The edge ring had been cycled (employed as a wafer holder) over 2,000 times in an RTP chamber and still continued to perform well, i.e., wafer temperature uniformity, high ramp rates, reduced lamp power.

What is claimed is:

1. A free-standing article comprising chemical vapor deposited low resistivity silicon carbide having an electrical resistivity of less than 0.10 ohm-cm.

2. The free-standing article of claim 1, wherein the electrical resistivity of the chemical vapor deposited low resistivity silicon carbide is from about 0.005 ohm-cm to about 0.05 ohm-cm.

3. The free-standing article of claim 1, wherein the chemical vapor deposited low resistivity silicon carbide is opaque to light at a wavelength of from about 0.1 µm to about 1.0 µm at a temperature of at least about 250° C.

4. The free-standing article of claim 3, wherein the chemical vapor deposited low resistivity silicon carbide is opaque to light at a wavelength of from about 0.1 µm to about 1.0 µm at a temperature of from at least about 250° C. to about 1450° C.

5. The free-standing article of claim 1, wherein the chemical vapor deposited low resistivity silicon carbide is opaque to light at a wavelength of from about 0.1 µm to about 1.0 µm at a temperature of from about 300° C. to about 1250° C.

6. The free-standing article of claim 3, wherein the chemical vapor deposited low resistivity silicon carbide is opaque to light in a wavelength range of from about 0.7 µm to about 0.95 µm.

7. The free-standing article of claim 1, wherein the chemical vapor deposited low resistivity silicon carbide has a nitrogen content of greater than $1.5 \times 10^{19}$ atoms/cm$^3$.

8. The free-standing article of claim 7, wherein the chemical vapor deposited low resistivity silicon carbide has a nitrogen content of from about $2 \times 10^{19}$ atoms/cm$^3$ to about $3 \times 10^{19}$ atoms/cm$^3$.

9. The free-standing article of claim 1, wherein the free-standing article is an edge ring or a susceptor ring, a wafer boat, epi susceptors, electrodes, heating elements, and plasma etch components.

10. The free-standing article of claim 9, wherein the plasma etch components comprise gas diffusion plates, focused rings, plasma screens, or plasma chamber walls.

11. An edge ring comprising chemical vapor deposited low resistivity silicon carbide having an electrical resisitivity of less than 0.10 ohm-cm, the edge ring comprises a circular main ring component that terminates at an outer surface with a support flange and terminates at an inner surface with a flange that is continuous with a wafer holding flange, the wafer holding flange terminates to define a center void.

12. The edge ring of claim 11, wherein the chemical vapor deposited low resistivity silicon carbide has an electrical resistivity of from about 0.005 ohm-cm to about 0.05 ohm-cm.

13. The edge ring of claim 11, wherein the chemical vapor deposited low resistivity silicon carbide is opaque to light at a wavelength of from about 0.1 µm to about 1.0 µm at a temperature of at least about 250° C.

14. The edge ring of claim 13, wherein the chemical vapor deposited low resistivity silicon carbide is opaque to light at a wavelength of from about 0.1 µm to about 1.0 µm at a temperature of from at least about 250° C. to about 1450° C.

15. The edge ring of claim 14, wherein the chemical vapor deposited low resistivity silicon carbide is opaque to light at a wavelength of from about 0.1 µm to about 1.0 µm at a temperature of from about 300° C. to about 1250° C.

16. The edge ring of claim 13, wherein the chemical vapor deposited low resistivity silicon carbide is opaque to light from about 0.7 µm to about 0.95 µm.

17. The edge ring of claim 11, wherein the edge ring has a thickness of from about 0.1 mm to about 1.0 mm.

18. The edge ring of claim 17, wherein the edge ring has a thickness of from about 0.25 mm to about 0.5 mm.

19. The edge ring of claim 11, further comprising a semiconductor wafer resting on the wafer holding flange.

20. The edge ring of claim 11, wherein the low resisitivty silicon carbide has a nitrogen content greater than $1.5 \times 10^{19}$ atoms/cm$^3$.

* * * * *